United States Patent
He et al.

(10) Patent No.: US 12,167,563 B2
(45) Date of Patent: Dec. 10, 2024

(54) METHOD AND APPARATUS FOR VENTURI NOZZLE HEAT EXHAUST FOR AN INFORMATION HANDLING SYSTEM

(71) Applicant: Dell Products, LP, Round Rock, TX (US)

(72) Inventors: Qinghong He, Austin, TX (US); Travis C. North, Cedar Park, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 233 days.

(21) Appl. No.: 17/967,258

(22) Filed: Oct. 17, 2022

(65) Prior Publication Data
US 2024/0130070 A1    Apr. 18, 2024

(51) Int. Cl.
*H05K 7/20* (2006.01)

(52) U.S. Cl.
CPC ..... *H05K 7/20145* (2013.01); *H05K 7/20172* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 5,313,362 A * | 5/1994 | Hatada | | G06F 1/203 361/736 |
| 6,288,895 B1 * | 9/2001 | Bhatia | | G06F 1/203 361/679.52 |
| 6,430,042 B1 * | 8/2002 | Ohashi | | H01L 23/467 257/E23.099 |
| 6,496,369 B2 * | 12/2002 | Nakamura | | G06F 1/1656 312/236 |
| 6,816,371 B2 * | 11/2004 | Agata | | G06F 1/203 361/679.48 |
| 7,028,753 B2 * | 4/2006 | Sterner | | H01L 23/467 165/122 |
| 7,120,015 B2 * | 10/2006 | Furuya | | G06F 1/203 361/679.48 |
| 7,457,113 B2 * | 11/2008 | Kumhyr | | G06F 1/203 361/679.48 |
| 8,281,605 B2 * | 10/2012 | Williams | | F25B 9/002 62/238.7 |
| 8,649,174 B2 | 2/2014 | Senatori | | |
| 8,790,839 B2 | 7/2014 | Braithwaite | | |
| 10,363,334 B2 | 7/2019 | Kuijper | | |

(Continued)

FOREIGN PATENT DOCUMENTS

EP    3061129 B1    1/2018

*Primary Examiner* — Courtney L Smith
(74) *Attorney, Agent, or Firm* — Prol Intellectual Property Law, PLLC; H. Kenneth Prol

(57) ABSTRACT

An information handling system may include a processor, a memory device, a video display device, and a PMU. The information handling system further includes a venturi nozzle cooling system exhaust vent including a base chassis including a top cover to form a first portion upper part of a venturi nozzle and a bottom cover to form a second portion lower part of the venturi nozzle at an exhaust vent at a rear wall of the base chassis and an airflow producing device, operatively coupled to the PMU and processor, to pass air from within the base chassis and through the venturi nozzle at the exhaust vent formed by the c-cover and d-cover to accelerate airflow away from the video display device.

20 Claims, 5 Drawing Sheets

(56) References Cited

U.S. PATENT DOCUMENTS

| | | | |
|---|---|---|---|
| 10,877,361 B2* | 12/2020 | Aoki | H05K 7/20336 |
| 2005/0057899 A1* | 3/2005 | Lord | F28F 3/048 |
| | | | 361/695 |
| 2008/0128119 A1 | 6/2008 | Ali | |
| 2012/0120593 A1 | 5/2012 | Senatori | |
| 2018/0311392 A1 | 11/2018 | Kuijper | |
| 2021/0386959 A1 | 12/2021 | Oddo | |

* cited by examiner

METHOD AND APPARATUS FOR VENTURI NOZZLE HEAT EXHAUST FOR AN INFORMATION HANDLING SYSTEM

FIELD OF THE DISCLOSURE

The present disclosure generally relates to cooling systems for information handling system. The present disclosure more specifically relates to a venturi nozzle cooling system exhaust vent exhaust vent for an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Under various operating conditions, especially high-performance conditions, information handling systems may generate heat which, if not mitigated, may affect performance. The information handling system may thus include a cooling system used to cool heat-generating hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
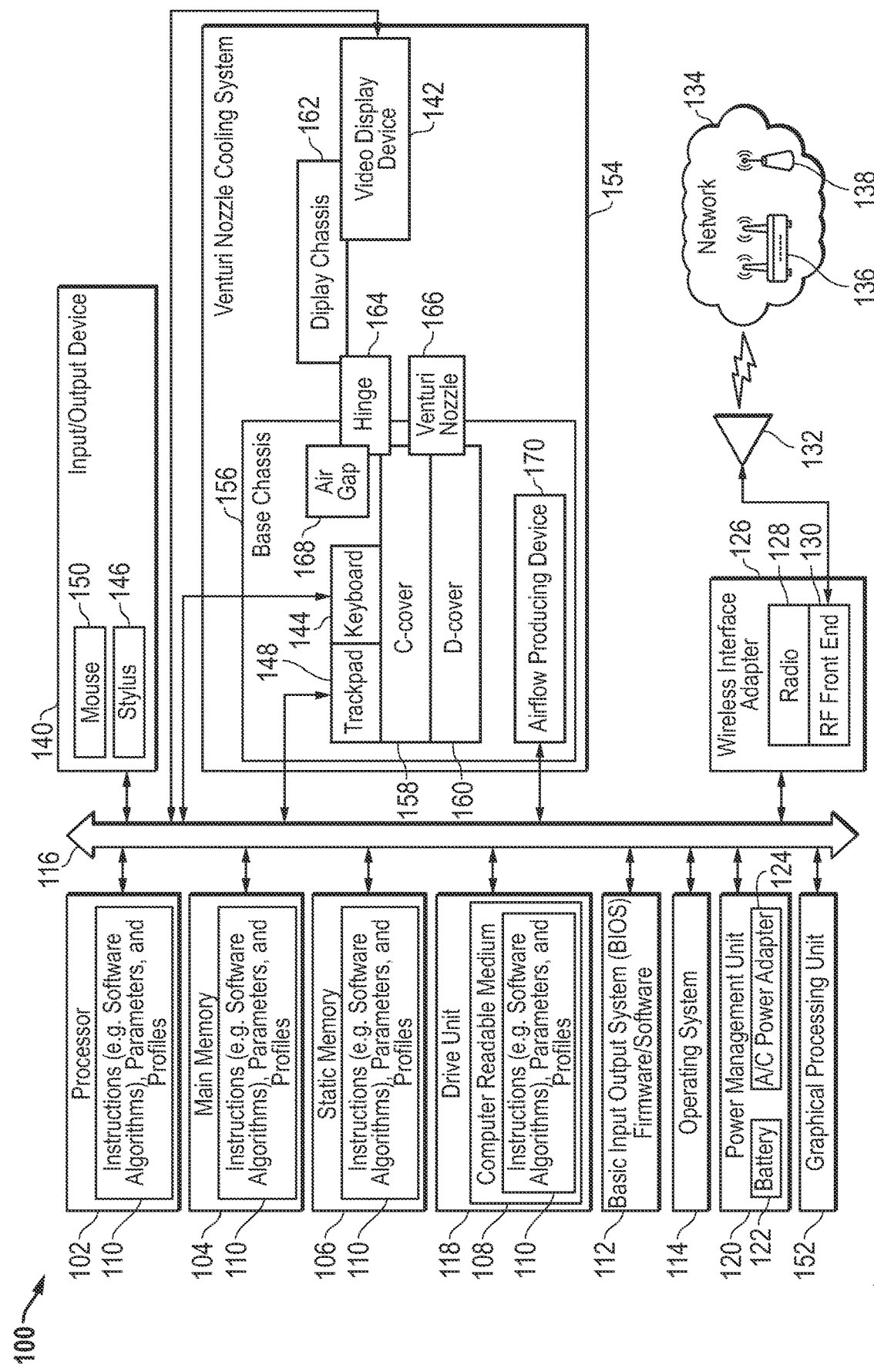
FIG. 1 is a block diagram of an information handling system with a venturi nozzle cooling system exhaust vent according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan or blower used to blow heat from within the housing to a vent to vent the heated air from within the housing. Although these fans or blowers effectively dissipate heat from within the housing, they may create locations along an exhaust vent where heat is accumulated. This heat may cause damage to certain other devices associated with the information handling system. In an example where the information handling system includes a rear exhaust vent formed below a display chassis of a laptop-type information handling system, heat expelled by the fan or blower may inadvertently heat up the video display device of the information handling system causing damage to the video display device.

The present specification describes a venturi nozzle cooling system exhaust vent that passes heat away from the housing of the information handling system via use of a venturi nozzle formed at or near a rear exhaust vent formed in the housing of the information handling system. In an embodiment, the venturi nozzle may include an inlet aperture portion that receives a vented airflow from a fan, blower, or other airflow producing device, through a necked aperture portion of the venturi nozzle, and out of an expansion aperture section of the venturi nozzle. Although a pressure drop of the airflow is realized at the necked aperture portion of the venturi nozzle, the velocity of the airflow is increased thereby causing the heated air to be expelled at the rear exhaust vent of the information handling system. By increasing the velocity of the airflow, the heated air is pushed further away from the housing thereby limiting the amount of heat accumulating at or near the video display device of the laptop-type information handling system. Although the present specification describes the venturi nozzle being formed within a base housing of a laptop-type information handling system, the present specification also contemplates the use of a venturi nozzle used to exhaust heat from with a housing of any type of information handling system.

In some embodiments, the chassis of a laptop type information handling system may include a display housing that includes an "a-cover" or display cover which serves as a back cover for the display housing and a "b-cover" which may include a bezel, if any, and a video display device (e.g., display screen) of the information handling system such as a laptop-type information handling system. In an example embodiment, this laptop information handling system may have a chassis that forms a base chassis and includes a "c-cover" or top cover housing, for example, a keyboard, touchpad/trackpad, and any cover in which these components are set. The base chassis may also include a "d-cover" or bottom cover housing, for example, a processing device, a memory, a power management unit (PMU), wireless interface adapters and other components of the information handling system for the laptop-type information handling system. In an embodiment, the top and bottom aperture portions of the venturi nozzle may be formed by a portion of the housing of the base chassis in combination with portion of the housing of the display chassis. In an embodiment, a "c-cover" of the base chassis forms a first portion or top portion of a venturi nozzle while a "d-cover" of the base chassis forms a second portion or bottom portion of the venturi nozzle at a rear wall of the base chassis. In an embodiment, an "a-cover" of the display chassis forms a third portion that extends the top portion and the length of the necked aperture section of the venturi nozzle when the display chassis is placed in an open state.

FIG. 1 illustrates an information handling system 100 similar to information handling systems according to several aspects of the present disclosure that is operatively couplable to a venturi nozzle cooling system exhaust vent 154 formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and can vary in size, shape, performance, price, and functionality. In embodiments described herein, the information handling system 100 is described as a laptop-type information handling system that includes a base chassis operatively coupled to a display chassis via a hinge. The present specification, however, contemplates these other types of information handling systems 100 and the presented example of a laptop-type information handling systems 100 are presented for ease of understanding.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, hardware processor, hardware controller, or any combination thereof. Additional components of the information handling system 100 can include one or more storage devices, one or more communications ports for communicating with external devices, as well as various input and output (110) devices 140, such as a keyboard 144, a mouse 150, a video display device 142, a stylus 146, a trackpad 148, or any combination thereof. In an embodiment, each I/O device 140 may be operatively coupled to the processor 102 executing a driver to interface with each of the I/O devices 140. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the devices or execute instructions for the one or more systems and modules described above, and operates to perform one or more of the methods described herein. For example, code instructions may be executed by a PMU controller or other hardware processing resource for an ionic emitter control system to control an ionic emitter airflow producing device 170 (e.g., emitter/collector ion pump) as part of a venturi nozzle cooling system 154 of embodiments herein. In another example, code instructions may be executed by a PMU controller or other hardware processing resource for a cooling fan control system to control a cooling fan airflow producing device 170 (e.g., a blower fan) as part of a venturi nozzle cooling system 154 of embodiments herein. The information handling system 100 may execute code instructions 110 via hardware processing resources that may operate on servers or systems, remote data centers, or on-box in individual client information handling systems according to various embodiments herein. In some embodiments, it is understood any or all portions of code instructions 110 may operate on a plurality of information handling systems 100.

The information handling system 100 may include hardware processing resources such as a hardware processor 102, a central processing unit (CPU), accelerated processing unit (APU), a neural processing unit (NPU), a vision processing unit (VPU), an embedded controller (EC), a digital signal processor (DSP), a GPU 152, a microcontroller, or any other type of hardware processing device that executes code instructions to perform the processes described herein. Any of the hardware processing resources may operate to execute code that is either firmware or software code. Moreover, the information handling system 100 can include memory such as main memory 104, static memory 106, computer readable medium 108 storing instructions 110 of, in an example embodiment, a venturi nozzle cooling system exhaust vent 154 (e.g., with an airflow producing device 170 controlled by a PMU controller), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to a venturi nozzle cooling system exhaust vent 154. The venturi nozzle cooling system exhaust vent 154 includes the operation of an airflow producing device 170 that creates an airflow through a venturi nozzle 166 formed in a base chassis of the information handling system. For example, the airflow producing deice 170 may be a cooling fan, an emitter/collector ion pump, or other air moving systems. In one example embodiment, a cooling fan may operate to generate airflow for cooling the information handling system 100. In another example embodiment, the emitter/collector ion pump may include an ion emitter operatively coupled to a high voltage source (e.g., a positive electrode) to create charged ions (e.g., cations) at the emitter and repel those ions from the emitter. The collector, in this embodiment, may be operative coupled to the high voltage source (e.g., a negative electrode) to attract the created ions towards the collector. The movement of the charged ions from the emitter to the collector creates an airflow by shear forces created by the charged ions moving through the atmosphere to drag air molecules as the airflow producing device 170. This produces airflow into the venturi nozzle 166 in an example embodiment. By passing air through the venturi nozzle 166, the heated air within the base housing of the information handling system 100 may be directed out and away from the information handling system 100 at a higher velocity.

In an embodiment, the venturi nozzle 166 may include an inlet aperture portion that receives an airflow from the airflow producing device 170. In an embodiment, the diameter of this inlet aperture section or portion of the venturi nozzle 166 may be equal or less than the entire thickness of the base chassis from an interior side of the c-cover to an interior side of the d-cover. The airflow produced by the airflow producing device 170 passes through a necked aperture section or portion of the venturi nozzle. The necked aperture portion of the venturi nozzle 166 has a smaller diameter than that of the diameter of the inlet of the venturi nozzle 166. The airflow then passes through an expansion aperture section or portion of the venturi nozzle 166 that leads outside of the housing of the base chassis of the information handling system 100. As the airflow passes through the necked aperture portion of the venturi nozzle 166, a pressure drop of the airflow is realized and, as a consequence, the velocity of the airflow is increased. By increasing the velocity of the airflow, the heated air is pushed further away from the housing of the information handling system 100 thereby limiting the amount of heat accumulating at or near the video display device 142 of the laptop-type information handling system 100. By limiting the amount of heat accumulating at or near the video display device 142, the damage, via heat, to the video display device 142 is limited.

As described herein, a laptop information handling system 100 may have a chassis that forms a base chassis 156 and includes a c-cover 158 or top cover housing, for example, a keyboard 144, touchpad/trackpad 148, and any cover in which these components are set. The base chassis 156 may also include a d-cover 160 or bottom cover housing, for example, a hardware processing device (e.g., processor 102, GPU 152, PMU 120 controller, or other hardware processor), a memory device (e.g., main memory 104, static memory 106, etc.), a PMU 120, wireless interface adapters 126 and other components of the information handling system 100 for the laptop-type information handling system 100. In an embodiment, the aperture portions of the venturi nozzle 166 may be formed by a portion of the housing of the base chassis 156 in combination with portion of the housing of the display chassis 162. In an embodiment, a c-cover 158 of the base chassis 156 forms a first portion of a venturi nozzle 166 while a d-cover 160 of the base chassis 156 forms a second portion of the venturi nozzle 166 at a rear wall of the base chassis 156. In an embodiment, an "a-cover" of the display chassis 162 forms a third portion of the venturi nozzle 166 when the display chassis 162 is placed in an open state.

As described herein, the base chassis 156 may be operatively coupled to a display chassis 162 via a hinge 164. In an embodiment, this hinge 164 may be a drop-down hinge that drops the display chassis 162 down as the display chassis 162 is placed in an open position. This drop-down hinge may place a portion of the video display device 142 housed within the display chassis 162 relatively closer to the rear heat exhaust vent. This may increase the heat received at, at least, a lower portion of the video display device 142 thereby increasing the degradation of the video display device 142 over time. To prevent this, the venturi nozzle 166 is placed at the rear heat exhaust vent. As described herein, the venturi nozzle 166 increases the velocity of the airflow out of the base chassis 156. Additionally, this increased velocity of airflow out of the expansion aperture portion of the venturi nozzle 166 also pulls in additional air through an air gap 168 formed between the base chassis 156 and display chassis 162 next to the drop-down hinge 164. In an embodiment, as the airflow exists the expansion aperture portion of the venturi nozzle 166 at the rear heat exhaust vent in the base chassis 156, the change in pressure resulting from the increased velocity of airflow draws cool air through the air gap 168 thereby cooling, at least, a lower portion of the video display device 142 housed in the display chassis 162. This prevents heat damage to the video display device 142 thereby increasing the usable life of the video display device 142 and increasing user satisfaction.

In an embodiment, the airflow producing device 170 is a blower or fan. In an embodiment, the airflow producing deice 170 may be an emitter/collector ion pump. The blower or fan may draw air into the base chassis 156 via, for example, an air intake vent formed in the d-cover 160. The blower may then create an airflow into the inlet aperture portion of the venturi nozzle 166, through the necked aperture portion of the venturi nozzle 166 increasing the velocity of the airflow, and out of the expansion aperture portion of the venturi nozzle 166 at a rear heat exhaust vent formed at a back side of the base chassis 156. In an embodiment, a single airflow producing device 170 may operate to create an airflow into a plurality of venturi nozzles 166 formed at the rear heat exhaust vent. In an embodiment, multiple airflow producing devices 170 may be used to create an airflow into a single venturi nozzle 166. In an embodiment, multiple airflow producing devices 170 may be used to produce an airflow through multiple venturi nozzle 166.

The information handling system 100 can include one or more sets of machine-readable code instructions 110 that can be executed by hardware processing resources to cause the computer system to perform any one or more of the methods or computer-based functions disclosed herein. For example, code instructions 110 may be executed for various software applications, software agents, a basic input/output system (BIOS) 112 firmware and/or software, or other aspects or components. Instructions 110 may execute a venturi nozzle cooling control system to control various aspects of the venturi nozzle cooling system exhaust vent 154 of the embodiments herein. In an embodiment, this may include controlling, via the hardware processor 102 or a PMU controller, the operation of the airflow producing device 170 such as the speed of a blower. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of code instructions 110 such as software can be embedded to be executed by the processor 102 or other processing devices such as a GPU 152 to perform the processes described herein. Similarly, main memory 104 and static memory 106 may also contain a computer-readable medium for storage of one or more sets of instructions, parameters, or profiles 110 described herein. The disk drive unit 118 or static memory 106 also contain space for data storage. Further, the instructions 110 may embody one or more of the methods as described herein. In a particular embodiment, the instructions, parameters, and profiles 110 may reside completely, or at least partially, within the main memory 104, the static memory 106, and/or within the disk drive 118 during execution by the processor 102 or GPU 152 of information handling system 100. The main memory 104, GPU 152, and the processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and executable code instructions to manage the power provided to the components of the information handling system 100 such as the hardware processor 102, and manage control of the airflow producing device 170 of the venturi nozzle cooling system exhaust vent 154 that includes, some embodiments, a fan motor and motor driver hardware. The PMU 120 may control power to one or more components including one or more drive units 118, the hardware processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute code instructions 110 of an ionic emitter control system to control the ionic emitter and fan rotation of the ionic emitter/collector ion pump air moving device based on detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. Note that an information handling system can include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
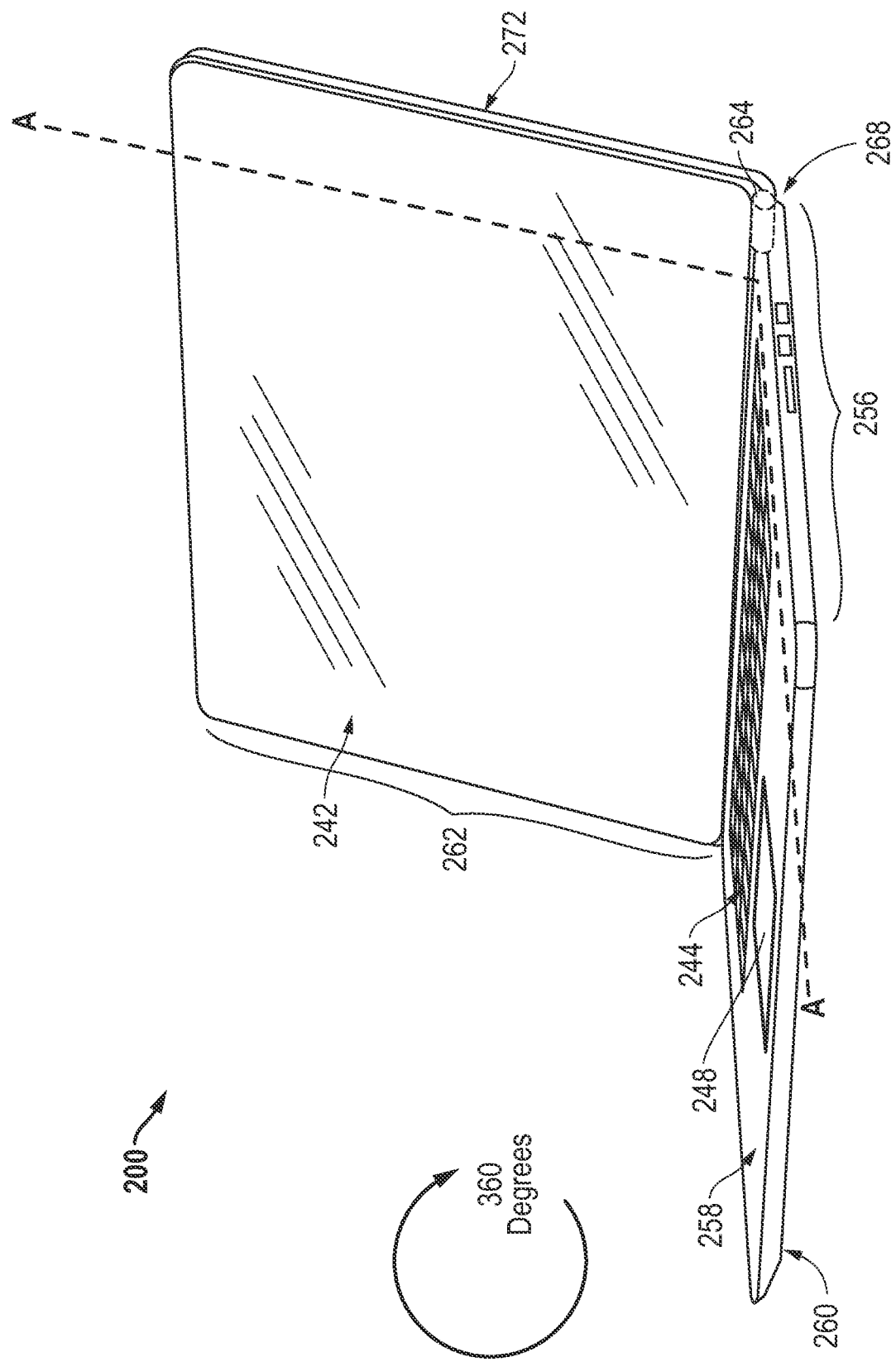
FIG. 2 is a graphic diagram of an information handling system housing a venturi nozzle cooling system exhaust vent according to an embodiment of the present disclosure.

FIG. 2 is a graphic diagram of an information handling system 200 housing a venturi nozzle cooling system exhaust vent (not shown) according to an embodiment of the present disclosure. The information handling system 200 may, in an example embodiment, be a laptop-type information handling system 200. In the example shown in FIG. 2, the information handling system 200 may be a 360° information handling system 200 where an exterior surface of the d-cover 260 or bottom cover of a base chassis 256 may be brought towards an exterior side of the a-cover 272 or back display cover of the display chassis 262 to place the information handling system 200 in a tablet configuration in one embodiment. As shown in FIG. 2, the information handling system 200 may also be placed in a laptop configuration where the base chassis 256 is lying flat on a surface with the display chassis 262 being placed upright from the base chassis 256. FIG. 2 also shows a cross-sectional line "A" that represents a view shown in FIGS. 3, 4, and 5 in an embodiment.

As described herein, the information handling system 200 may include a plurality of metal chassis. The information handling system 200, in an embodiment, may comprise an outer metal case or shell of an information handling system 200 for housing internal components of the information handling system 200, such as a video display device, a cursor control device, and an alpha numeric input device (e.g., keyboard 244). As shown in FIG. 2, the information handling system 200 may include a video display device/b-cover 242 functioning to enclose the video display chassis 262 with the a-cover 270 described herein. As another example, the information handling system 200 may further include the c-cover 258 or top cover functioning to enclose a cursor control device such as a trackpad 248 and/or a keyboard 244 acting as an alpha numeric input device. The a-cover 270 and the video display device/b-cover 242 may be joined together in an embodiment to form a fully enclosed display chassis 262, while the c-cover 258 and the d-cover 260 may be joined together to form a fully enclosed base chassis 256. Taking a closed configuration as a reference position of the display chassis 262 including the a-cover 270 and the video display device/b-cover 242 and the base chassis 256 including the c-cover 258 and the d-cover 260, the display chassis 262 including the a-cover 270 and the video display device/b-cover 242 may be rotated away from the base chassis 256 to a laptop configuration as shown in FIG. 2.

As described herein, the rear exhaust vent (not shown) may be formed on a rear surface where the d-cover 260 and c-cover 258 are coupled together. Additionally, the base chassis 256 may be operatively coupled to a display chassis 262 via a hinge 264. In an embodiment, this hinge 264 may be a drop-down hinge that drops the display chassis 262 down as the display chassis 262 is placed in an open position as shown. This drop-down hinge 264 may place a portion of the video display device 242 housed within the display chassis 262 relatively closer to the rear heat exhaust vent. This may increase the heat received at, at least, a lower portion of the video display device 242 thereby increasing the degradation of the video display device 242 over time. To prevent this, the venturi nozzle described herein is formed at the rear heat exhaust vent. The venturi nozzle increases the velocity of the airflow out of the base chassis 256 to push the heated air further away from the display device 242. Additionally, this increased velocity of airflow out of the expansion aperture portion of the venturi nozzle also pulls in additional air through an air gap 268 formed between the base chassis 256 and display chassis 262 nest to the drop-down hinge 264 and into the necked aperture portion. In an embodiment, the airflow from the base chassis through the necked aperture portion to the expansion aperture portion of the venturi nozzle at the rear heat exhaust vent in the base chassis 256 generates a change in pressure resulting in the increased velocity of airflow that also draws cool air through the air gap 268. Cool air pulled into the air gap 268 thereby cools, at least, a lower portion of the video display device 242 housed in the display chassis 262. This also prevents heat damage to the video display device 242 thereby increasing the usable life of the video display device 242 and increasing user satisfaction.

Figure 3:
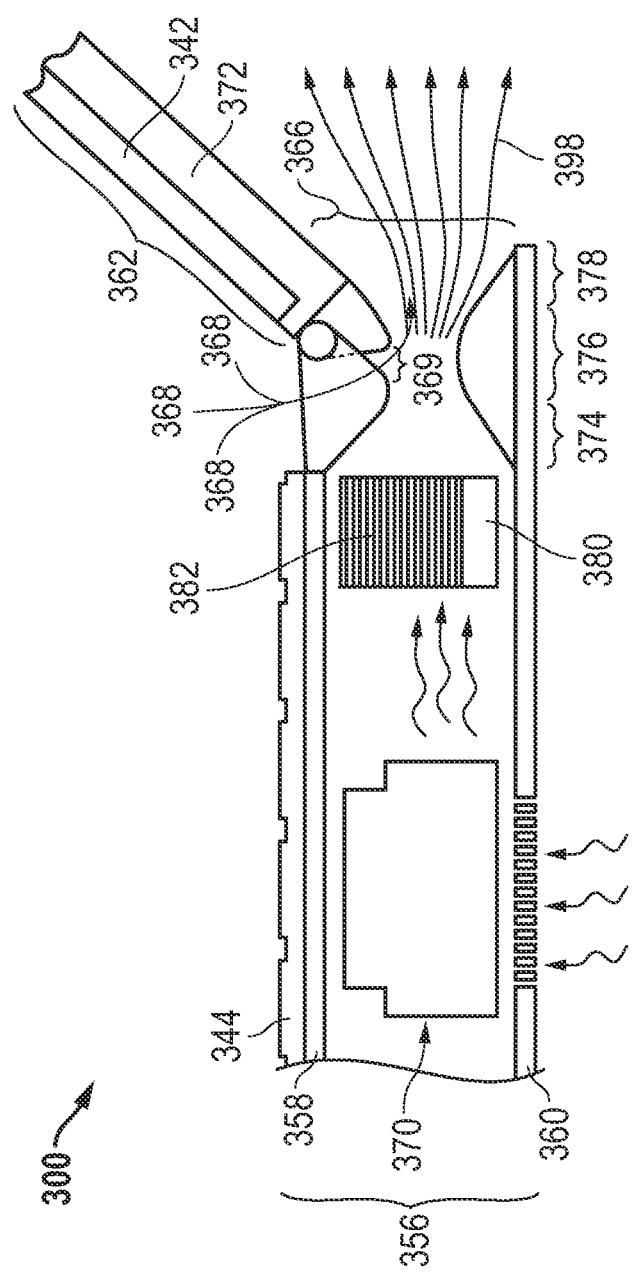
FIG. 3 is a graphic diagram cross-sectional view of a venturi nozzle cooling system exhaust vent formed within a base chassis of an information handling system in an embodiment of the present disclosure.

FIG. 3 is a graphic diagram cross-sectional view of a venturi nozzle cooling system exhaust vent formed within a base chassis 356 of an information handling system in an embodiment of the present disclosure. The cross-sectional view as shown in FIG. 3 may be a view along cross-sectional line "A" as shown in FIG. 2. The example embodiment shown in FIG. 3 shows the convertible or laptop information handling system 300 in a laptop configuration. As described herein, the information handling system 300 may be in a laptop configuration when the display chassis 362 is moved away from the base chassis 356 such that a video display device/b-cover 342 of the display chassis 362 can be viewed by a user operating the information handling system 300.

As described herein, the base chassis 356 of the information handling system 300 includes a c-cover 358 and a d-cover 360. The c-cover 358 houses, for example, a keyboard 344, a touchpad/trackpad (not shown), and/or any cover in which these components are set. The d-cover 360 houses, for example, a processing device (not shown), a memory (not shown), a PMU (not shown), wireless interface adapters (not shown) or other heat-generating components, an airflow producing device 370, a set of thermal fins 382, and/or a heat conductive device 380 such as passive cooling elements like a heat pipe, cold plate, or heat sink, along with other components of the information handling system 300. During operation, the airflow producing device 370 passes air over the heat conductive device 380 and thermal fins 382, draws heat from the heat conductive device 380 and thermal fins 382, and passes that heated air out from the base chassis 356 through the venturi nozzle 366 described herein.

The display chassis 362, in an example embodiment, includes an a-cover 372 and a video display device/b-cover 342. The a-cover 372 may house components of, for example circuitry associated with a webcam, circuitry associated with the video display device 342 among other hardware associated with the display chassis 362. The video display device/b-cover 342 may be, in an embodiment, a video display device 342 that may or may not include a bezel. For example, in an embodiment, the video display device/b-cover 342 may include a bezel used to secure the video display device/b-cover 342 to the a-cover 372. In an embodiment, a webcam may be formed either through a bezel or through a video display device/b-cover 342.

As described herein, the information handling system 300 may include and be operatively coupled to a venturi nozzle cooling system exhaust vent. The venturi nozzle cooling system exhaust vent includes the operation of an airflow producing device 370 that creates an airflow 398 through a venturi nozzle 366 formed in a base chassis of the information handling system. By passing air through the venturi nozzle 366, the heated air within the base chassis 356 of the information handling system 300 may be directed out and away from the information handling system 300 at a higher velocity so heated air is pushed away from the display device 342 in an embodiment.

In an embodiment, the venturi nozzle 366 may include an inlet aperture portion 374 that receives an airflow 398 from the airflow producing device 370. In an embodiment, the diameter of this inlet aperture portion 374 of the venturi nozzle 366 may be equal or less than the entire thickness of the base chassis 356 from an interior side of the c-cover 358 to an interior side of the d-cover 360. The airflow 398 produced by the airflow producing device 370 passes through a necked aperture portion 376 of the venturi nozzle 366. The necked aperture portion 376 of the venturi nozzle 366 has a smaller diameter than that of the diameter of the inlet aperture portion 374 of the venturi nozzle 366. The airflow 398 then passes through an expansion aperture portion 378 of the venturi nozzle 366 that leads outside of the housing of the base chassis 356 of the information handling system 300. As the airflow 398 passes through the necked aperture portion 376 of the venturi nozzle 366, a pressure decrease and an air velocity increase is realized. Additionally, as the airflow 398 passes through the expansion aperture portion 378, the velocity of the airflow 398 may then decrease as the pressure increases as compared to the airflow through the necked aperture portion 376 of the venturi nozzle 366. By increasing or accelerating the velocity of the airflow 398 via the venturi nozzle 366 exhaust, the heated air is pushed further away from the base chassis 356 and display chassis 362 of the information handling system 300 thereby limiting the amount of heat accumulating at or near the video display device/b-cover 342 of the laptop-type information handling system 300. By limiting the amount of heat accumulating at or near the video display device/b-cover 342, the damage, via heat, to the video display device/b-cover 342 is limited.

As described herein, the base chassis 356 may be operatively coupled to a display chassis 362 via a hinge 364. In an embodiment, this hinge 364 may be a drop-down hinge that drops the display chassis 362 down as the display chassis 362 is opened to a laptop position. This drop-down hinge 364 may place a portion of the video display device/b-cover 342 of the display chassis 362 relatively closer to the rear heat exhaust vent formed by the venturi nozzle 366. This may increase the heat received at, at least, a lower portion of the video display device/b-cover 342 thereby increasing the degradation of the video display device/b-cover 342 over time without the venturi nozzle 366. To prevent this, the venturi nozzle 366 is placed at the rear heat exhaust vent. As described herein, the venturi nozzle 366 increases the velocity of the airflow 398 out of the base chassis 356. Additionally, this increased velocity of airflow 398 out of the expansion aperture portion of the venturi nozzle 366 also pulls in additional air 368 through an air gap 369 formed between the base chassis 356, display chassis 362, and hinge 364. In an embodiment, with the airflow 398 at the expansion aperture portion of the venturi nozzle 366 at the rear heat exhaust vent in the base chassis 356, the change in pressure from the necked aperture portion 376 to the expansion aperture portion 378 results in the increased velocity of airflow 398 which draws cool air 368 through the air gap 369 thereby cooling, at least, a lower portion of the video display device 342 of the video display device/b-cover 342. This prevents heat damage to the video display device/b-cover 342 thereby increasing the usable life of the video display device/b-cover 342 and increasing user satisfaction. Additionally, this may enhance cooling of the hardware (e.g., a processor, GPU, or other heat-producing hardware) housed within the base chassis 356.

In an embodiment, the airflow producing device 370 is a blower or fan. The airflow producing device 370 may be an emitter/collector ion pump in an embodiment. The blower, fan, or other device may draw air into the base chassis 356 via, for example, an air intake vent formed into the d-cover 360. The blower or fan may then create an airflow 398 into the inlet aperture portion 374 of the venturi nozzle 366, through the necked aperture portion 376 of the venturi nozzle 366 increasing the velocity of the airflow 398, and out of the expansion aperture portion 378 of the venturi nozzle 366 at a rear heat exhaust vent formed at a back side of the base chassis 356. In an embodiment, a single airflow producing device 370 may operate to create an airflow 398 into a plurality of venturi nozzles 366 formed at the rear heat exhaust vent. In an embodiment, multiple airflow producing devices 370 may be used to create an airflow 398 into a single venturi nozzle 366. In an embodiment, multiple airflow producing devices 370 may be used to produce an airflow 398 through multiple venturi nozzles 366 along a rear of the information handling system or at other exhaust vent locations.

As described herein, in an embodiment, the c-cover 358 of the base chassis 356 forms a first portion or upper portion of a venturi nozzle 366 while a d-cover 360 of the base chassis 356 forms a second portion or lower portion of the venturi nozzle 366 at a rear wall of the base chassis 356. As shown in FIG. 3, the first portion of the venturi nozzle 366 may include a portion of the hinge 364 body that is part of or coupled to the c-cover 358. Further, a second portion or lower portion of the venturi nozzle 366 may be formed out of a portion of the d-cover 360. In an embodiment, this second portion may be an entire half (e.g., along a length of the venturi nozzle 366) of the venturi nozzle 366. In one embodiment, a portion of the housing of the a-cover 372 forms a third portion of the venturi nozzle 366 to increase the size of the upper portion and extend the length of the necked aperture portion 376 when the display chassis 362 is opened to a laptop configuration, for example. In some embodiments, this third upper portion of the housing of the a-cover 372 may not be available when the display chassis 362 is in a closed position. However, the venturi nozzle 366 may still operate without this third portion by having a shorter-length necked aperture portion 376 and may not increase airflow velocity as much. It is appreciated, however, that if the display chassis 362 is placed in a closed position, heat expelled out of the base chassis 356 may not accumulate near, at least, a lower portion of the video display device/b-cover 342 since the display 342 is not as close to the heat exhaust vent. However, where the drop-down hinge 364 places the video display device/b-cover 342 near the venturi nozzle 366, the portion of the display chassis 362 that helps to form a third portion of the venturi nozzle 366 increases the size of the upper portion of the venturi nozzle 366 and extends the necked aperture portion 376. This larger venturi nozzle 366 upper portion may serve to both increase the pressure changes within the venturi nozzle 366 resulting in increase airflow 398 velocity as well as draw air flow 368 through the air gap 369 as described herein cooling, at least, a lower portion of the video display device/b-cover 342.

Figure 4:
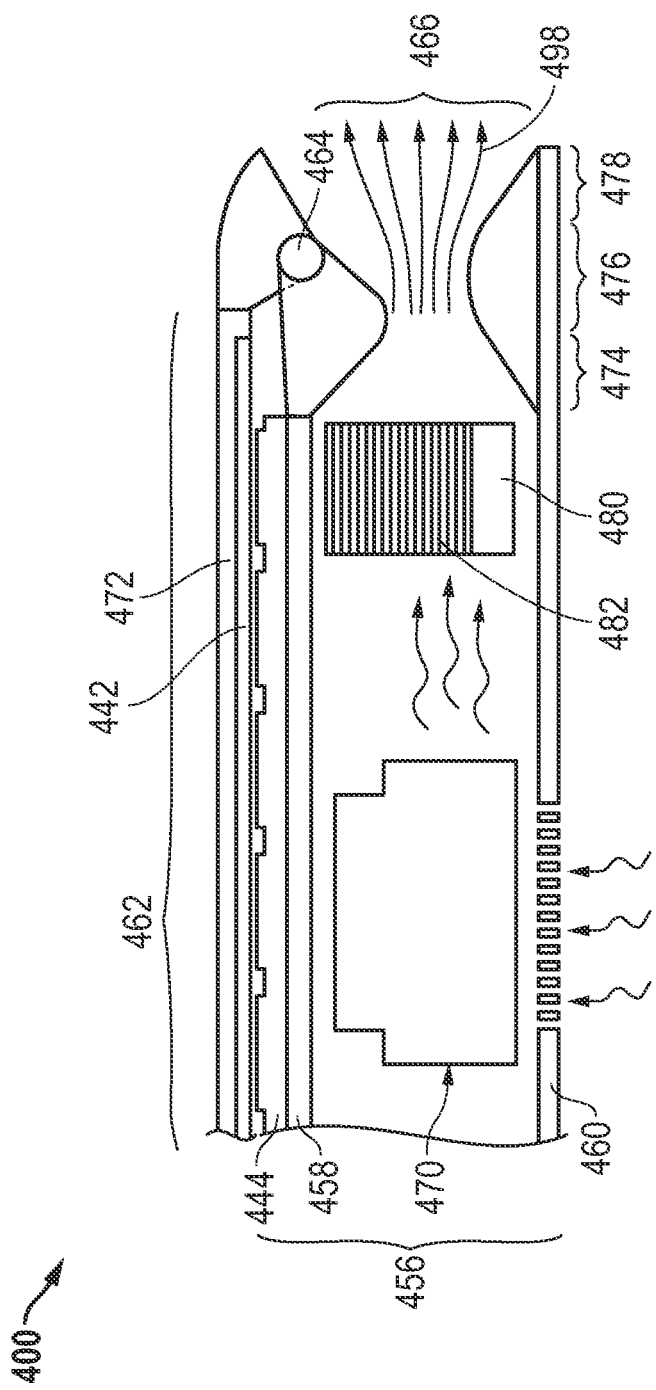
FIG. 4 is a graphic diagram cross-sectional view of a venturi nozzle cooling system exhaust vent formed within a base chassis of an information handling system with a display chassis in a closed position in an embodiment of the present disclosure.

FIG. 4 is a graphic diagram cross-sectional view of a venturi nozzle cooling system exhaust vent formed within a base chassis 456 of an information handling system 400 with a display chassis in a closed position in an embodiment of the present disclosure. The cross-sectional view as shown in FIG. 4 may be a view along cross-sectional line "A" as shown in FIG. 2 and similar to that shown in FIG. 3. The example embodiment shown in FIG. 4 shows the laptop-type information handling system 400 in a closed state. As described herein, the information handling system 400 may be in an open, laptop configuration by a user when the user moves the display chassis 462 away from the base chassis 456 such that a video display device/b-cover 442 of the display chassis 462 can be viewed by the user operating the information handling system 400.

As described herein, the base chassis 456 of the information handling system 400 includes a c-cover 458 or top cover and a d-cover 460 or bottom cover. The c-cover 458 houses, for example, a keyboard 444, a touchpad/trackpad (not shown), and/or any cover in which these components are set. The d-cover 460 houses, for example, a processing device (not shown), a memory (not shown), a PMU (not shown), wireless interface adapters (not shown), or other heat-producing components, an airflow producing device 470, a set of thermal fins 482, and/or a heat conductive device 480 such as a heatpipe or other passive cooling structure along with other components of the information handling system 400. During operation, the airflow producing device 470 passes air over the heat conductive device 480 and thermal fins 482, conducts heat from the heat conductive device 480 and thermal fins 482, and passes that heated air out from the base chassis 456 through the venturi nozzle 466 described herein.

The display chassis 462, in an example embodiment, includes an a-cover 472 and a video display device/b-cover 442. The a-cover 472 may house components of, for example circuitry associated with a webcam, circuitry associated with the video display device 442 among other hardware associated with the display chassis 462. The video display device/b-cover 442 may be, in an embodiment, a video display device 442 that may or may not include a bezel. In an embodiment, the video display device/b-cover 442 may include a bezel used to secure the video display device/b-cover 442 to the a-cover 472. In an embodiment, a webcam may be formed either through a bezel or through a video display device/b-cover 442.

As described herein, the information handling system 400 may include and be operatively coupled to a venturi nozzle cooling system exhaust vent. The venturi nozzle cooling system exhaust vent includes the operation of an airflow producing device 470 that creates an airflow 498 through a venturi nozzle 466 formed in a base chassis of the information handling system. By passing air through the venturi nozzle 466, the heated air within the base chassis 456 of the information handling system 400 may be directed out and away from the information handling system 400 at a higher velocity.

In an embodiment, the venturi nozzle 466 may include an inlet aperture portion 474 that receives an airflow from the airflow producing device 470. In an embodiment, the diameter of this inlet aperture portion 474 of the venturi nozzle 466 may be equal or less than the entire thickness of the base chassis 456 from an interior side of the c-cover 458 to an interior side of the d-cover 460. The airflow 498 produced by the airflow producing device 470 passes through a necked aperture portion 476 of the venturi nozzle 466. The necked aperture portion 476 of the venturi nozzle 466 has a smaller diameter than that of the diameter of the inlet aperture portion 474 of the venturi nozzle 466. The airflow 498 then passes through an expansion aperture portion 478 of the venturi nozzle 466 that leads outside of the housing of the base chassis 456 of the information handling system 400. As the airflow 498 passes through the necked aperture portion 476 of the venturi nozzle 466, a pressure drop of the airflow to the expansion portion 478 is realized and, as a consequence, the velocity of the airflow 498 is increased. By increasing the velocity of the airflow 498, the heated air is pushed further away from the base chassis 456, display chassis 462, and other parts of the information handling system 400. As described herein this may also limit the amount of heat accumulating at or near the video display device/b-cover 442 of the laptop-type information handling system 400 despite the display chassis 462 being placed in a closed position.

In an embodiment, the airflow producing device 470 is a blower or fan. In an embodiment, the airflow producing device 470 may be am emitter/collector ion pump. The blower, fan, or other airflow producing device may draw air into the base chassis 456 via, for example, an air intake vent formed into the d-cover 460. The blower or fan may then create an airflow 498 into the inlet aperture portion 474 of the venturi nozzle 466, through the necked aperture portion 476 of the venturi nozzle 466 increasing the velocity of the airflow 498, and out of the expansion aperture portion 478 of the venturi nozzle 466 at a rear heat exhaust vent formed at a back side of the base chassis 456. In an embodiment, a single airflow producing device 470 may operate to create an airflow 498 into a plurality of venturi nozzles 466 formed at the rear heat exhaust vent. In an embodiment, multiple airflow producing devices 470 may be used to create an airflow into a single venturi nozzle 466. In an embodiment, multiple airflow producing devices 470 may be used to produce an airflow 498 through multiple venturi nozzles 466 across plural exhaust vents across the back of the information handling system.

As described herein, in an embodiment, the c-cover 458 of the base chassis 456 forms a first portion of a venturi nozzle 466 while a d-cover 460 of the base chassis 456 forms a second portion of the venturi nozzle 466 at a rear wall of the base chassis 456. As shown in FIG. 4, the first portion or top portion of the venturi nozzle 466 may include a portion of the hinge 464 body associated or coupled to the c-cover 458. Further, a second portion or bottom portion of the venturi nozzle 466 may be formed out of a portion of the d-cover 460. In an embodiment, this second portion or bottom portion may be an entire half (e.g., along a length of the venturi nozzle 466) of the venturi nozzle 466. As shown in FIG. 4, a portion of the housing of the a-cover 472 that forms a third portion of the venturi nozzle 366 in FIG. 3 when the display chassis 462 is placed in an open laptop configuration is now missing due to the display chassis 462 being placed in a closed position. However, the venturi nozzle 466 may still operate without this third portion because the first portion of the venturi nozzle 466 reduces the interior diameter of the venturi nozzle 466 albeit with a shorter-length necked aperture portion 476. Since the upper portion of venturi nozzle 466 is not a long in a closed configuration as with venturi nozzle 366 of FIG. 3 when the information handling system is in a laptop configuration, the velocity of the airflow may not be increased much or heated air pushed as far as with FIG. 3. Nonetheless, the venturi nozzle 466 still operates to increase airflow velocity to still help to push the heated airflow away from the display chassis 462. It is appreciated, therefore, that when the display chassis 462 is placed in a closed position, heat expelled out of the base chassis 456 may not accumulate near, at least, a lower portion of the video display device/b-cover 442.

Figure 5:
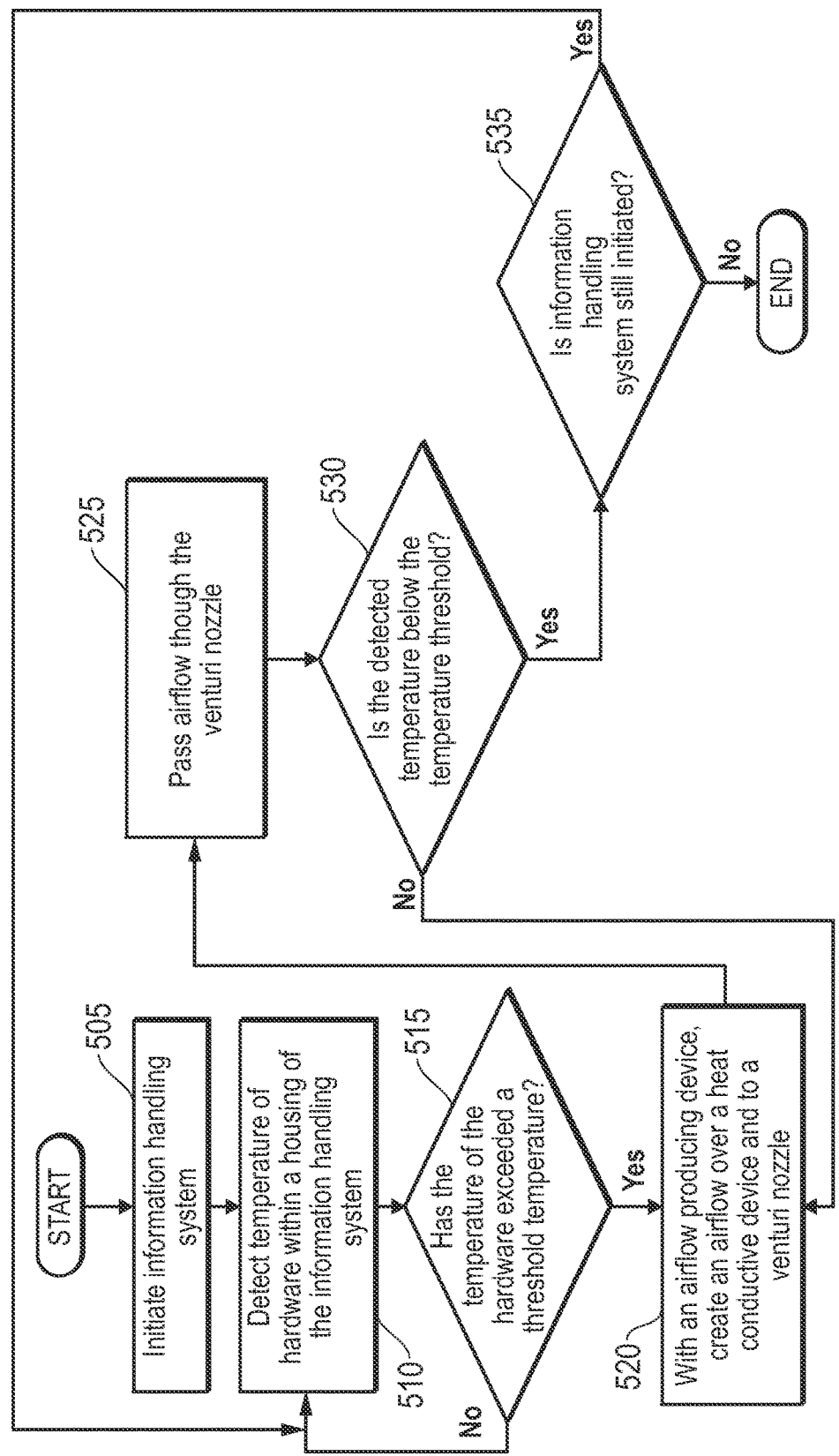
FIG. 5 is a flow diagram of a method of cooling a video display device of an information handling system according to an embodiment of the present disclosure.

FIG. 5 illustrates a flowchart for a method of method of cooling a video display device of an information handling system according to an embodiment of the present disclosure. The method 500 includes, at block 505 with initiating the information handling system. This initiation process may be conducted by the user actuating, for example, a power key on the information handling system. The actuation of this power key may cause the execution of a native BIOS, a native OS, or other code instructions used and executed by the processor of the information handling system to operate the hardware within the information handling system including the venturi nozzle cooling system exhaust vent described herein. In an embodiment, the initiation of the information handling system may further include an initiation of a hardware controller, a PMU controller, or hardware processor to execute code instructions of a venturi nozzle cooling system exhaust vent to control an airflow producing device for the venturi nozzle cooling system exhaust vent described herein.

At block 510, the temperature of the hardware within the housing of the information handling system may be detected. In an embodiment, the temperature of the hardware that is detected may be detected using a temperature sensor coupled to one or more hardware devices such as the hardware processor, PMU controller, or other hardware processing resource, battery, or video display device, for example, of the information handling system among other hardware devices. Other example embodiments may include a processing management system that measures the processing resources consumed by any type of processing device and calculates an interior temperature of the housing of the information handling system. The temperature sensor such as a thermistor may report a temperature of the information handling system (e.g., a specific hardware device or a temperature in a housing of the information handling system) to the venturi nozzle cooling system exhaust vent.

At block 515, the method 500 may include determining if the temperature of the hardware exceeds a threshold temperature with the venturi nozzle cooling system exhaust vent. The activation of any other active cooling systems within the housing of the information as well as the venturi nozzle cooling system exhaust vent described herein may depend on whether a threshold temperature has been reached. In another example embodiment, the process of determining if the threshold temperature has been achieved may determine whether to increase or decrease a speed of a fan or blower, for example, to create, respectively, stronger or weaker airflow towards the venturi nozzle. Where the threshold temperature has not been reached at block 515, the method 500 may continue to block 510 again to detect the temperature of the hardware within the housing of the information handling system.

Where the first temperature threshold is reached, the activation of the venturi nozzle cooling system exhaust vent includes, at block 520, activating the airflow producing device to create an airflow over a heat conductive device and to the venturi nozzle. In an embodiment, the venturi nozzle may include an inlet aperture portion that receives an airflow from the airflow producing device. In an embodiment, the diameter of this inlet aperture portion of the venturi nozzle may be equal or less than the entire thickness of the base chassis from an interior side of the c-cover to an interior side of the d-cover.

The method 500 further includes, at block 525, passing airflow through the venturi nozzle. The airflow produced by the airflow producing device passes through a necked aperture portion of the venturi nozzle. The necked aperture portion of the venturi nozzle has a smaller diameter than that of the diameter of the inlet of the venturi nozzle. The airflow then passes through an expansion aperture portion of the venturi nozzle that leads outside of the housing of the base chassis of the information handling system. As the airflow passes through the necked aperture portion of the venturi nozzle, a pressure drop of the airflow to the expansion aperture portion is realized and, as a consequence, the velocity of the airflow is increased. By increasing the velocity of the airflow, the heated air is pushed further away from the housing of the information handling system thereby limiting the amount of heat accumulating at or near the video display device of the laptop-type information handling system. By limiting the amount of heat accumulating at or near the video display device, the damage, via heat, to the video display device is limited.

The method 500 may continue to block 530 to determine whether the detected temperature is below the threshold temperature as a result of the activation of the airflow producing device and the cooling of the hardware within the base chassis of the information handling system. Where the temperature detected is not below the threshold temperature, the method 500 may return to block 520 with continuing to produce the airflow via the airflow producing device and passing that airflow to and through the venturi nozzle as described herein.

Where the temperature is detected to be below the threshold temperature at block 530, the method 500 includes determining, at block 545, whether the information handling system is still initiated. Where the information handling system is no longer initiated (e.g., power has been removed from the information handling system via actuation of a power button), the method 500 may end here. Where the information handling system is still initiated, the method 500 may return to block 510 as described herein.

The blocks of the flow diagrams of FIG. 5 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
 a processor;
 a memory device;
 a video display device;
 a power management unit (PMU);
 a venturi nozzle cooling system exhaust vent including:
  a base chassis including a top cover to form a first portion upper part of a venturi nozzle and a bottom cover to form a second portion lower part of the venturi nozzle at an exhaust vent at a rear wall of the base chassis; and
  an airflow producing device, operatively coupled to the PMU and processor, to pass air from within the base chassis and through the venturi nozzle at the exhaust vent formed by the top cover and bottom cover to accelerate airflow away from the video display device.

2. The information handling system of claim 1 further comprising:
 a display chassis operatively coupled to the base chassis via a hinge, the display chassis forming a third portion to extend the upper part of the venturi nozzle when the display chassis is opened to a laptop configuration.

3. The information handling system of claim 1 further comprising:
 a display chassis operatively coupled to the base chassis via a drop-down hinge that creates an air gap between the display chassis and the base chassis.

4. The information handling system of claim 3 further comprising:
 the airflow producing device creating the airflow through the venturi nozzle that draws air through the air gap to cool a portion of the video display device formed into the display chassis.

5. The information handling system of claim 1 further comprising:
 a passive cooling device placed between the airflow producing device and the venturi nozzle to, via heat conductance, conduct heat to an internal aperture of the venturi nozzle to be cooled by the airflow producing device and expel heat from within a housing of the information handling system in the airflow accelerated away from the video display device by the venturi nozzle.

6. The information handling system of claim 1, wherein the airflow producing device is a blower fan.

7. The information handling system of claim 1, wherein the airflow producing device is an emitter/collector ion pump air moving device.

8. The information handling system of claim 1, wherein the passive cooling device is a set of thermal fins that is placed between the airflow producing device and the venturi nozzle to dissipate heat conducted from a heat pipe operative coupled to the thermal fins.

9. A venturi nozzle cooling system exhaust vent comprising:
 a base chassis including a top cover to form a first upper portion of a venturi nozzle and a bottom cover to form a second bottom portion of the venturi nozzle at the exhaust vent on a rear wall of the base chassis of an information handling system;
 a display chassis operatively coupled to the base chassis via a hinge; and
 an airflow producing device, operatively coupled to a power management unit (PMU), to pass air from within the base chassis and through the venturi nozzle formed by the top cover and bottom cover of the base chassis to accelerate airflow moving away from the base chassis.

10. The venturi nozzle cooling system exhaust vent of claim 9 further comprising:
 a display chassis operatively coupled to the base chassis via a hinge, the display chassis forming a third portion to extend the first upper portion of the venturi nozzle when the display chassis is opened to a laptop configuration.

11. The venturi nozzle cooling system exhaust vent of claim 9 further comprising:
 the hinge being a drop-down hinge that physically separates an air gap between the display chassis and the base chassis.

12. The venturi nozzle cooling system exhaust vent of claim 11 further comprising:
 the airflow producing device creates the airflow through the venturi nozzle and draws air through the air gap to cool a portion of a video display device formed into the display chassis.

13. The venturi nozzle cooling system exhaust vent of claim 9 further comprising:
 a passive cooling device placed between the airflow producing device and the venturi nozzle to, via heat conductance, conduct heat to an internal aperture of the venturi nozzle to be cooled by the airflow producing device and expel heat from within a housing of the information handling system in the airflow accelerated away from the base chassis by the venturi nozzle.

14. The venturi nozzle cooling system exhaust vent of claim 9, wherein the airflow producing device is a cooling fan.

15. The venturi nozzle cooling system exhaust vent of claim 9, wherein the airflow producing device is an emitter/collector ion pump air moving device.

16. The venturi nozzle cooling system exhaust vent of claim 9, wherein the passive cooling device is a set of thermal fins that is placed between the airflow producing device and the venturi nozzle to dissipate heat conducted from a heat pipe operative coupled to the thermal fins via the airflow through the venturi nozzle.

17. An information handling system comprising:
 a processor;
 a memory device;
 a video display device;
 a power management unit (PMU);
 a venturi nozzle cooling system exhaust vent including:
  a base chassis including a top cover to form a first portion upper part of a venturi nozzle and a bottom cover to form a second portion lower part of the venturi nozzle at an exhaust vent at a rear wall of the base chassis; and
  an airflow producing device, operatively coupled to the PMU and processor, to pass air from within the base chassis and through an inlet aperture section, a necked aperture section, and an expansion aperture section of the venturi nozzle at the exhaust vent formed by the top cover and bottom cover to accelerate airflow away from the video display device.

18. The information handling system of claim 17, further comprising:
a display chassis forming a third portion upper part or the venturi nozzle to extend the necked portion aperture of the first portion upper part of the venturi nozzle when the display chassis is opened to a laptop configuration.

19. The information handling system of claim 17 further comprising:
the base chassis include plural venturi nozzles at plural exhaust vents along a rear wall of the base chassis.

20. The information handling system of claim 17, wherein the air producing device is a blower fan.

* * * * *